United States Patent
Lee et al.

(10) Patent No.: US 10,461,283 B2
(45) Date of Patent: Oct. 29, 2019

(54) ORGANIC LIGHT EMITTING DISPLAY DEVICE AND REPAIR METHOD THEREOF

(71) Applicant: LG DISPLAY CO., LTD., Seoul (KR)

(72) Inventors: YoonJu Lee, Gangneung-si (KR); JeongHwan Kim, Seoul (KR); SooHong Choi, Paju-si (KR); HongJae Shin, Seoul (KR); KwangMo Park, Uijeongbu-si (KR); JaYeon Song, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/297,223

(22) Filed: Mar. 8, 2019

(65) Prior Publication Data

US 2019/0206300 A1   Jul. 4, 2019

Related U.S. Application Data

(62) Division of application No. 14/980,784, filed on Dec. 28, 2015, now Pat. No. 10,276,078.

(30) Foreign Application Priority Data

Dec. 29, 2014 (KR) .................. 10-2014-0192565

(51) Int. Cl.
*H01L 51/56* (2006.01)
*G09G 3/20* (2006.01)
(Continued)

(52) U.S. Cl.
CPC ............ *H01L 51/56* (2013.01); *G09G 3/003* (2013.01); *G09G 3/2003* (2013.01);
(Continued)

(58) Field of Classification Search
CPC .... G09G 3/2003; G09G 3/003; G09G 3/3233; G09G 3/3291; G09G 3/3283; G09G 2300/0426; G09G 2300/043; G09G 2320/0242; G09G 2330/08; G09G 2330/10; H01L 27/3248; H01L 27/3276; H01L 51/56; H01L 2251/568
See application file for complete search history.

(56) References Cited

U.S. PATENT DOCUMENTS

2008/0309602 A1  12/2008 Hwang
2013/0147858 A1   6/2013 Omoto

FOREIGN PATENT DOCUMENTS

CN         101017262 A    8/2007
CN         101046930 A   10/2007
(Continued)

OTHER PUBLICATIONS

English translation of CN103810965, Published on May 21, 2014, Inventor Cai Tao, Applicant Shanghai Tianma Micro Elelc Co.*

*Primary Examiner* — William Boddie
*Assistant Examiner* — Saifeldin E Elnafia
(74) *Attorney, Agent, or Firm* — Birch, Stewart, Kolasch & Birch, LLP

(57) ABSTRACT

By forming a repair structure in a horizontal direction and vertical direction by using one or more repair lines between two or more pixels adjacent to each other in a display panel, even though a dark spot appears due to a defective operation of one pixel, the one pixel may be compensated to be driven by using the other pixel.

3 Claims, 10 Drawing Sheets

(51) Int. Cl.
*G09G 3/3291* (2016.01)
*G09G 3/00* (2006.01)
*H01L 27/32* (2006.01)
*G09G 3/3233* (2016.01)
*G09G 3/3283* (2016.01)

(52) U.S. Cl.
CPC ......... *G09G 3/3233* (2013.01); *G09G 3/3291* (2013.01); *H01L 27/3248* (2013.01); *H01L 27/3276* (2013.01); *G09G 3/3283* (2013.01); *G09G 2300/043* (2013.01); *G09G 2300/0426* (2013.01); *G09G 2320/0242* (2013.01); *G09G 2330/08* (2013.01); *G09G 2330/10* (2013.01); *H01L 2251/568* (2013.01)

(56) References Cited

FOREIGN PATENT DOCUMENTS

| | | |
|---|---|---|
| CN | 101424792 A | 5/2009 |
| CN | 101533844 A | 9/2009 |
| CN | 102402943 A | 4/2012 |
| CN | 102707467 A | 10/2012 |
| CN | 102736341 A | 10/2012 |
| CN | 103810965 A | 5/2014 |
| CN | 104103234 A | 10/2014 |
| JP | 2002-278476 A | 9/2002 |

\* cited by examiner

FIG. 11B (New Sheet)

ORGANIC LIGHT EMITTING DISPLAY DEVICE AND REPAIR METHOD THEREOF

CROSS-REFERENCE TO RELATED APPLICATION

This application is a Divisional of U.S. patent application Ser. No. 14/980,784 filed on Dec. 28, 2015, which claims the benefit of priority to Korean Patent Application No. 10-2014-0192565 filed on Dec. 29, 2014, all of which are hereby expressly incorporated by reference into the present application.

BACKGROUND OF THE INVENTION

Field of the Invention

The present disclosure relates to an organic light emitting display device, and particularly, to an organic light emitting display device having a pixel repair structure and a pixel repair method thereof.

Discussion of the Related Art

Flat panel displays such as a liquid crystal display (LCD), a field emission display (FED), a plasma display panel (PDP), and an organic light emitting display device may replace existing cathode ray tube (CRT) display devices.

Among them, the organic light emitting display device is a self-luminous device which uses an organic light emitting diode (OLED), having advantages in that it has high luminance and low operational voltage characteristics, a fast response speed, and a wide viewing angle.

FIG. 1 is an equivalent circuit diagram of a pixel of a related art organic light emitting display device.

As illustrated in FIG. 1, in the organic light emitting display device, a plurality of lines GL and DL to which a scan signal and a data voltage (data) are input are formed to intersect with each other, and a pixel P, that is, a single subpixel, is defined in an intersection. The pixel P includes an OLED, a switching TFT (ST), a driving TFT (DT), and a storage capacitor C.

The OLED is disposed between the driving TFT (DT) and a base voltage source (EVSS). In response to the scan signal, the switching TFT (ST) applies the data voltage (data) to a gate electrode of the driving TFT (DT). The driving TFT (DT) applies a current flowing from the driving voltage EVDD, that is, a drain-source current, to the OLED according to a voltage applied from the switching TFT (ST). The storage capacitor C maintains a voltage applied to the gate electrode of the driving TFT (DT) during 1 frame period of the organic light emitting display device. A plurality of pixels P are arranged in a matrix form in a display panel of the organic light emitting display device.

As organic light emitting display devices are increased in size, a probability of occurrence of defective pixels in the display panel of the organic light emitting display device including the aforementioned pixels P is increased. Also, display panels are discarded due to defective pixels, a production yield of organic light emitting display devices is degraded. Thus, the related art organic light emitting display device employs a structure for repairing a defective pixel occurring in a display panel.

FIG. 2 is a view illustrating a pixel repair structure of the related art organic light emitting display device.

As illustrated in FIG. 2, the related art organic light emitting display device employs a pixel repair structure in which anode electrodes of OLEDs of a first pixel P1 and a second pixel P2 adjacent up and down in the display panel are connected by using a repair line RL.

In the pixel repair structure, for example, when the driving TFT (DT) of the first pixel P1 is defective, a connection between the driving TFT (DT) and the OLED of the first pixel P1 is cut using a laser. Also, an anode electrode of the OLED and one side of the repair line RL are welded, and the other side of the repair line RL and an anode electrode of the OLED of the second pixel P2 are welded. Accordingly, the first pixel P1 is repaired to be operated by the driving TFT (DT) of the second pixel P2.

However, in the organic light emitting display device based on the related art pixel repair structure, the display quality is degraded when a 3D image is displayed. In other words, in a case in which a left eye 2D image and a right eye 2D image are output by horizontal lines to display a 3D image on the display panel of the organic light emitting display device, pixels displaying the left eye 2D image and pixels displaying the right eye 2D image are simultaneously operated according to the related art pixel repair.

Thus, in the related art organic light emitting display device, spots such as a bright spot or dark spot are recognized in a 3D image, degrading the display quality of the 3D image.

SUMMARY OF THE INVENTION

Therefore, an aspect of the detailed description is to provide an organic light emitting display device capable of enhancing the display quality of a 3D image by changing a pixel repair structure, and a repair method thereof.

To achieve these and other advantages and in accordance with the purpose of this specification, as embodied and broadly described herein, an organic light emitting display device includes a display panel, a timing controller, and a data driver.

The display panel can include a plurality of pixels including an OLED in every pixel area defined as a plurality of scan lines and a plurality of data lines intersect with each other. A repair structure is formed in at least one of a horizontal direction and a vertical direction by one or more repair lines between two or more adjacent pixels among the plurality of pixels.

When a dark spot occurs in a pixel of the display panel, the timing controller may generate compensation data, and adjust a magnitude of image data according to the compensation data and output the same.

The data driver outputs a data voltage to the plurality of data lines of the display panel according to the image data adjusted in magnitude.

In the organic light emitting display device according to an embodiment of the present disclosure, by forming a repair structure in a horizontal direction and vertical direction between one pixel P and another pixel P adjacent in the horizontal direction and vertical direction, even though a spot such as a dark spot appears due to a defective operation of one pixel P, the pixel having the defective operation may be compensated and driven by using the other pixel P. Thus, the production yield of the organic light emitting display device according to an embodiment of the present disclosure may be enhanced.

Also, in the organic light emitting display device according to an embodiment of the present disclosure, by forming the repair structure in a horizontal direction with respect to a subpixel W among the plurality of subpixels adjacent in a horizontal direction in the display panel and forming a repair structure in a vertical direction with respect to the other subpixels, when a 3D image is displayed on the organic light emitting display device, the subpixels W having the repair structure in the horizontal direction display the same 2D image, and thus, a bright spot generated as a left eye image and a right eye image are simultaneously displayed in a 3D image may be prevented.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIGS. 10A and 10B are views schematically illustrating pixel compensation driving based on a repair structure formed in a horizontal direction in a display panel according to an embodiment of the present invention.

FIGS. 11A and 11B are views schematically illustrating pixel compensation driving based on a repair structure formed in a vertical direction in a display panel according to an embodiment of the present invention.

DETAILED DESCRIPTION OF THE EMBODIMENTS

Figure 1:
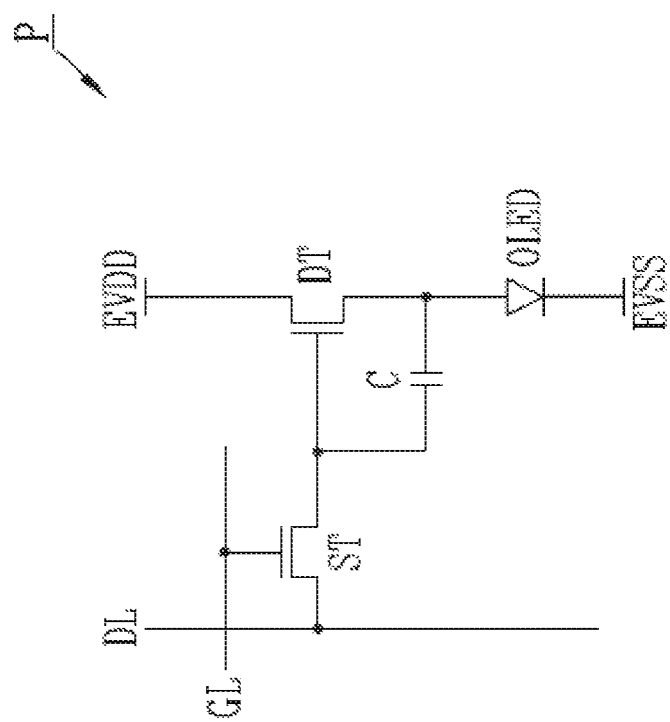
FIG. 1 is an equivalent circuit diagram of a pixel of a related art organic light emitting display device.
Figure 2:
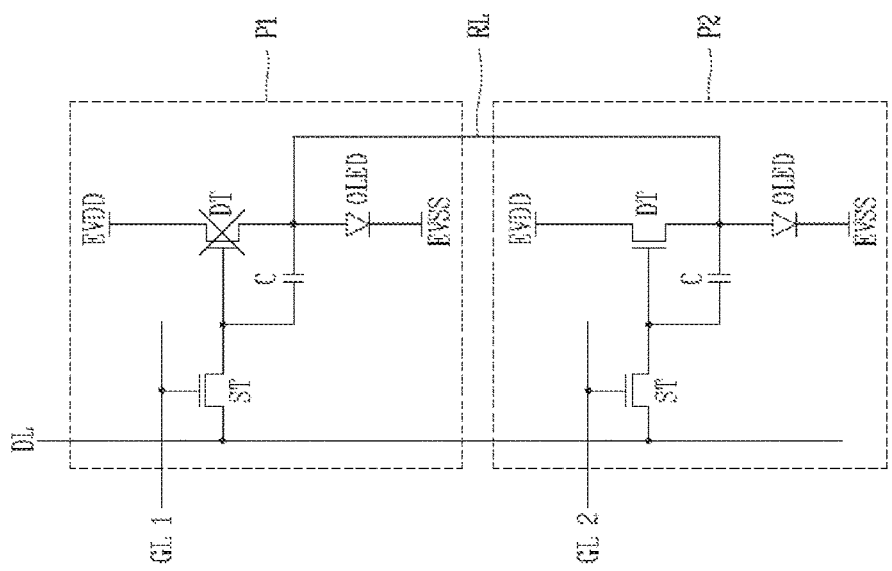
FIG. 2 is a view illustrating a pixel repair structure of the related art organic light emitting display device.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. Like reference numerals designate like elements throughout the specification.

Hereinafter, an organic light emitting display device and a repair method thereof according to an embodiment of the present disclosure will be described in detail with reference to the accompanying drawings.

Figure 3:
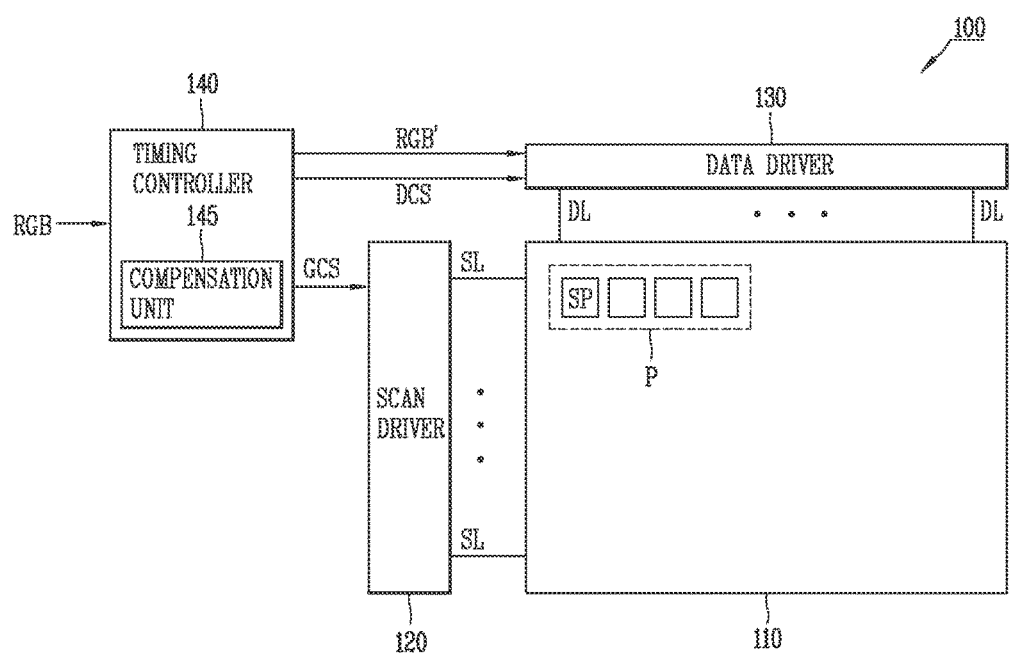
FIG. 3 is a view illustrating a configuration of an organic light emitting display device according to an embodiment of the present invention.
Figure 4:
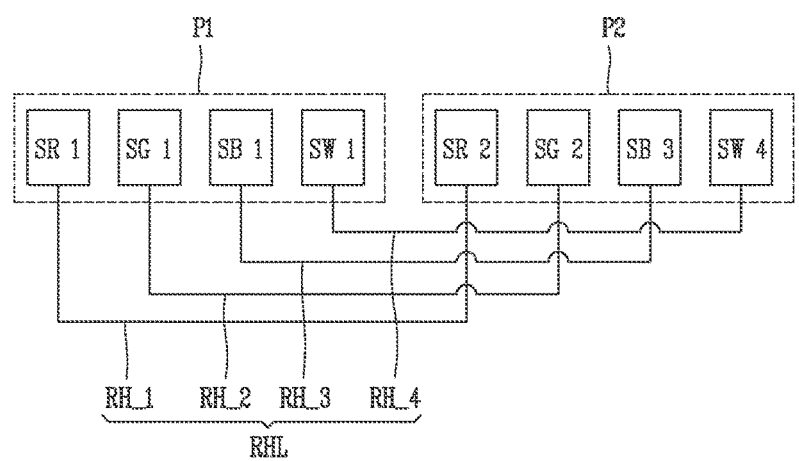
FIG. 4 is a view schematically illustrating a pixel repair structure of a display panel illustrated in FIG. 3.

FIG. 3 is a view illustrating a configuration of an organic light emitting display device according to an embodiment of the present disclosure, and FIG. 4 is a view schematically illustrating a pixel repair structure of a display panel illustrated in FIG. 3. All the components of the organic light emitting display device according to all the embodiments of the present disclosure are operatively coupled and configured.

As illustrated in FIG. 3, an organic light emitting display device 100 may include a display panel 110, a scan driver 120, a data driver 130, and a timing controller 140.

A plurality of scan lines SL and a plurality of data lines DL are formed to intersect with each other, and pixels P may be arranged in a matrix form in intersections in the display panel 110. A power line supplying a driving voltage EVDD and a base voltage EVSS to each pixel P may be further formed in the display panel.

A single pixel P may include four subpixels SP. For example, a single pixel P may include subpixel R (SR), subpixel G (SG), subpixel B (SB), and a subpixel W (SW). The four subpixels SR, SG, SB, and SW are not limited in arrangement order, and R, G, B and W preferably can represent red, green, blue and white, respectively.

Meanwhile, in the display panel 110, two pixels adjacent in a horizontal direction in the display panel 110, that is, a first pixel P1 and a second pixel P2 connected to the same scan line SL and adjacent side to side may be connected to each other through one or more horizontal repair line RHL to from a repair structure.

As illustrated in FIG. 4, a subpixel R (SR 1) of the first pixel P1 may be connected to a subpixel R (SR2) of the second pixel P2 through a first horizontal repair line RH_L A subpixel G (SG 1) of the first pixel P1 may be connected to a subpixel G (SG2) of the second pixel P2 through a second horizontal repair line RH_2. A subpixel B (SB 1) and a subpixel W (SW1) of the first pixel P1 may be connected to a subpixel B (SB2) and a subpixel W (SW2) of the second pixel P2 through third and fourth horizontal repair lines RH_3 and RH_4.

In this manner, since the repair structure is formed between two pixels adjacent in the horizontal direction in the display panel 110, even though one of the two pixels does not operate, the inoperable pixel may be repaired through the other pixel to perform a compensation operation.

Referring back to FIG. 3, the scan driver 120 may generate a plurality of scan signals according to a scan control signal GCS provided from the timing controller 140. The scan driver 120 may sequentially output a scan signal to the plurality of scan lines SL of the display panel 110. The scan driver 120 may include a general shift register and a level shifter.

The data driver 130 may convert video data RGB' into a data voltage according to a data control signal DCS provided from the timing controller 140, and output the data voltage to a plurality of data lines DL of the display panel 110.

The timing controller 140 may generate a scan control signal GCS and a data control signal DCS according to timing signals such as a clock signal and vertical and horizontal synchronization signals provided from an external system (not shown). Also, the timing controller 140 may convert an image signal RGB provided from the external system into image data RGB' that may be processed by the display panel 110, and output the same. The scan control signal GCS may be output to the scan driver 120, and the data control signal DCS may be output together with the image data RGB' to the data driver 130.

The timing controller 140 may include a compensation unit 145. The compensation unit 145 may generate compensation data to compensate for a blind spot generated in one of the plurality of pixels P of the display panel 110. The compensation data may be reflected in the image data RGB', and by adjusting a magnitude of the image data RGB', the data driver 130 may adjust a magnitude of a data voltage output to the other pixel P repairing the pixel P with a blind spot.

Figure 5:
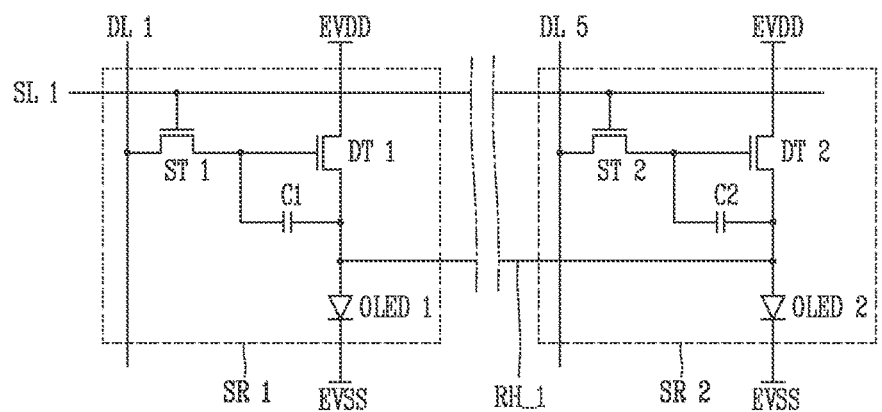
FIG. 5 is a circuit diagram having a pixel repair structure with respect to a subpixel R of the display panel illustrated in FIG. 3.
Figure 6:
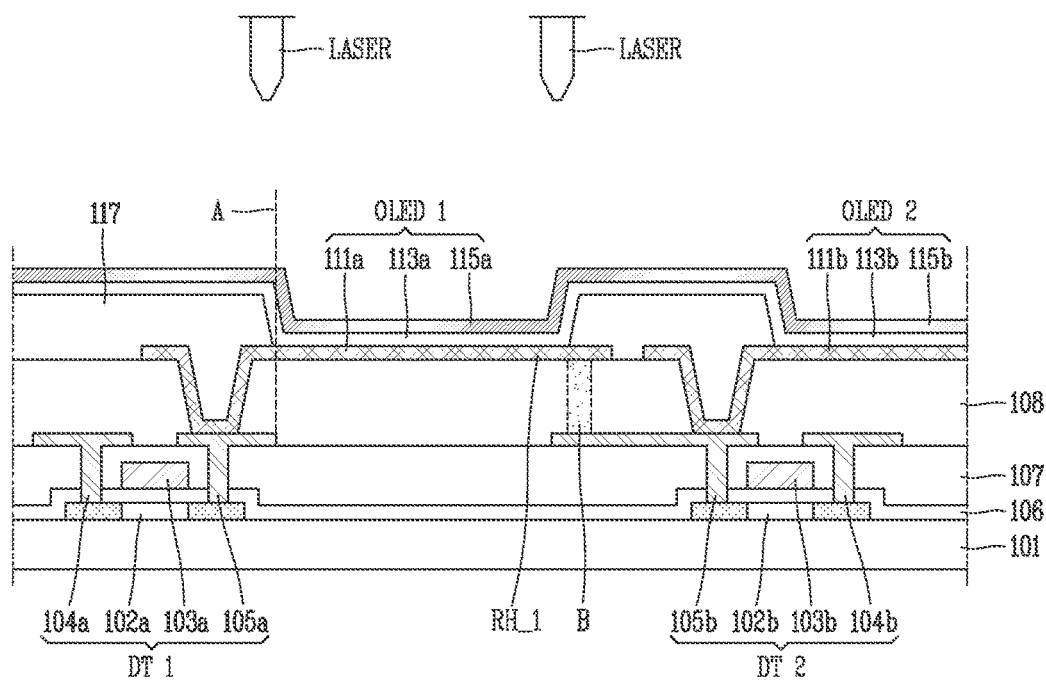
FIG. 6 is a cross-sectional view illustrating a portion of the circuit illustrated in FIG. 5.

FIG. 5 is a circuit diagram having a pixel repair structure with respect to a subpixel R of the display panel illustrated in FIG. 3, and FIG. 6 is a cross-sectional view illustrating a portion of the circuit illustrated in FIG. 5.

As illustrated in FIG. 5, the display panel 110 may have a repair structure formed between two pixels adjacent in the horizontal direction, that is, between the subpixel R (SR1) of the first pixel P1 and the subpixel R (SR2) of the second pixel P2 adjacent side to side.

The subpixel R (SR1) of the first pixel P1 may include a first switching TFT (ST1), a first driving TFT (DT1), a first OLED (OLED1), and a first storage capacitor C1. The subpixel R (SR2) of the second pixel P2 may include a second switching TFT (ST2), a second driving TFT (DT2), a second OLED (OLED2), and a second storage capacitor C2. The subpixel R (SR1) of the first pixel P1 and the subpixel R (SR2) of the second pixel P2 may be connected to each other through a first horizontal repair line RH_1 to form a repair structure.

For the purposes of description, hereinafter, the subpixel R (SR1) of the first pixel P1 and the subpixel R (SR2) of the second pixel P2 will be referred to as a subpixel 1R and a subpixel 2R, respectively.

The first switching TFT (ST1) of the subpixel IR (SR1) and the second switching TFT (ST2) of the subpixel 2R (SR2) are connected to the same scan line, that is, to the first scan line SL1 and may be operated according to a scan signal applied through the first scan line SL1.

A gate electrode of the first switching TFT (ST1) may be connected to the first scan line SL1, a drain electrode thereof may be connected to a first data line DL1, and a source electrode thereof may be connected to a gate electrode of the first driving TFT (DT1).

A gate electrode of the second switching TFT (ST2) may be connected to the first scan line SL1, a drain electrode thereof may be connected to a fifth data line DL5, and a source electrode thereof may be connected to a gate electrode of the second driving TFT (DT2).

The first driving TFT (DT1) may be turned on according to a voltage applied to the gate electrode and control a magnitude of a current flowing from the driving voltage EVDD to the first OLED (OLED1) according to a gate-source voltage Vgs. The driving voltage EVDD may be applied to the drain electrode of the first driving TFT (DT1), and a source electrode thereof may be connected to an anode electrode of the first OLED (OLED1).

The second driving TFT (DT1) may be turned on according to a voltage applied to the gate electrode and control a magnitude of a current flowing from the driving voltage EVDD to the second OLED (OLED2) according to the gate-source voltage Vgs. The driving voltage EVDD may be applied to the drain electrode of the second driving TFT (DT2), and a source electrode thereof may be connected to an anode electrode of the second OLED (OLED2).

The first storage capacitor C1 and the second storage capacitor C2 may uniformly maintain the voltage applied to gate electrodes of the first driving TFT (DT1) and the second driving TFT (DT2) during 1 frame period.

As illustrated in FIG. 6, a first semiconductor layer 102a and a second semiconductor layer semiconductor layer 102b may be formed on a substrate 101. The first semiconductor layer 102a and the second semiconductor layer 102b may be spaced apart from one another from each other by a predetermined interval, for example, by a predetermined number of data lines DL. The semiconductor layer 102a and the second semiconductor layer 102b may be formed on the same layer through the same process. The first semiconductor layer 102a and the second semiconductor layer 102b may each include a channel region formed of pure polysilicon and a source/drain region doped with an impurity.

A gate insulating layer 106 may be formed on the first semiconductor layer 102a and the second semiconductor layer 102b. On the gate insulating layer 106, a first gate electrode 103a corresponding to the channel region of the first semiconductor layer 102a and a second gate electrode 103b corresponding to the channel region of the second semiconductor layer 102b are formed.

An interlayer insulating layer 107 may be formed on the first gate electrode 103a and the second gate electrode 103b. A contact hole exposing the source/drain region of each of the first semiconductor layer 102a and the second semiconductor layer 102b may be formed in the interlayer insulating layer 107 and the gate insulating layer 106.

A first source electrode 105a and a first drain electrode 104a connected to the source/drain region of the first semiconductor layer 102a may be formed on the interlayer insulating layer 107. Also, a second source electrode 105b and a second drain electrode 104b connected to the source/drain region of the second semiconductor layer 102b may be formed through the same process. Here, the first source electrode 105a and the second source electrode 105b may face each other.

In this manner the first driving TFT DT1 of the subpixel 1R (SR1) including the first semiconductor layer 102a, the first gate electrode 103a, the first source electrode 105a, and the first drain electrode 104a may be formed. Also, the second driving TFT (DT2) of the subpixel 2R (SR2) including the second semiconductor layer 102b, the second gate electrode 103b, the second source electrode 105b, and the second drain electrode 104b may be formed.

As illustrated in FIG. 5, the first OLED (OLED1) may be connected between the first driving TFT (DT1) and the base voltage EVSS. An anode electrode of the first OLED (OLED1) may be connected to the source electrode of the first driving TFT (DT1) and the base voltage EVSS may be applied to a cathode of the first OLED (OLED1).

The second OLED (OLED2) may be connected between the second driving TFT (DT2) and the base voltage EVSS. An anode electrode of the second OLED (OLED2) may be connected to the source electrode of the second driving TFT (DT2) and the base voltage EVSS may be applied to a cathode of the second OLED (OLED2).

The first OLED (OLED1) may be connected to the second driving TFT (DT2) or the second OLED (OLED2) through a first horizontal repair line RH_1. Here, the first horizontal repair line RH_1 may be a line formed as the anode electrode of the first OLED (OLED1) or the anode electrode of the second OLED (OLED2) extends. However, the first horizontal repair line RH_1 may be an additional line formed of a metal.

As illustrated in FIG. 6, a protective layer 108 may be formed on the first driving TFT (DT1) and the second driving TFT (DT2). Contact holes exposing the first source electrode 105a of the first driving TFT (DT1) and the second source electrode 105b of the second driving TFT (DT2) may be formed in the protective layer 108.

A first anode electrode 111a connected to the first source electrode 105a of the first driving TFT (DT1) through the contact hole may be formed on the protective layer 108. One end of the first anode electrode 111a may extend to overlap the second source electrode 105b of the second driving TFT (DT2) to form a first horizontal repair line RH_1. The first horizontal repair line RH_1 may be integrally formed with the first anode electrode 111a.

Also, a second anode electrode 111b connected to the second source electrode 105b of the second driving TFT (DT2) through the contact hole may be formed on the protective layer 108. The second anode electrode 111b may be formed to be separated from the first anode electrode 111a.

A bank layer 117 may be formed on the first anode electrode 111a and the second anode electrode 111b. The bank layer 117 may expose a portion of the first anode electrode 111a and a portion of the second anode electrode 111b. The regions exposed by the bank layer 117 may be emission regions.

Organic emission layers 113a and 113b may be formed on the bank layer 117. The organic emission layers 113a and 113b may be formed to cover the bank layer 117 on the entire surface of the substrate 101. Cathode electrodes 115a and 115b may be formed on the organic emission layers 113a and 113b. The cathode electrodes 115a and 115b may be formed to cover the organic emission layers 113a and 113b on the entire surface of the substrate 101.

In this manner, the first OLED (OLED1) of the subpixel IR (SR1) including the first anode electrode 111a, the organic emission layer 113a, and the cathode electrode 115a may be formed on the first driving TFT (DT1). Also, the second OLED (OLED2) of the subpixel 2R SR2 including the second anode electrode 111b, the organic emission layer 113b, and the cathode electrode 115b may be formed on the second driving TFT (DT2).

In FIG. 6, a case in which the organic emission layers 113a and 113b and the cathode electrodes 115a and 115b are formed on the entire surface of the substrate 101 is illustrated as an example. However, the present disclosure is not limited thereto and the organic emission layers 113a and 113b and the cathode electrodes 115a and 115b may be separately formed to correspond to the anode electrodes thereof, that is, the first anode electrode 111a and the second anode electrode 111b, respectively.

As described above, in the display panel 110 of the present exemplary embodiment, the first horizontal repair line RH_1 may be integrally formed at the end of the first anode electrode 111a of the first OLED (OLED1) provided in the subpixel 1R (SR1). Also, the first horizontal repair line RH_1 extends to overlap the second source electrode 105b of the second driving TFT (DT2) of the subpixel 2R (SR2), forming a horizontal repair structure between the subpixel 1R SR1 and the subpixel 2R (SR2).

Thus, even though the first driving TFT (DT1) of the subpixel 1R (SR1) is defective in operation, the second driving TFT (DT2) and the first OLED (OLED1) may be connected through the first horizontal repair line RH_1. Through this connection, the first OLED (OLED1) may be operated by the second driving TFT (DT2), and accordingly, the subpixel IR (SR1) may be prevented from having a dark spot due to a defective operation of the first driving TFT (DT1).

In other words, when the first driving TFT (DT1) of the subpixel 1R (SR1) is defective in operation, a connection portion A between the first driving TFT (DT1) and the first OLED (OLED1) may be cut by using a laser. Here, a portion in which the first source electrode 105a of the first driving TFT (DT1) and the first anode electrode 111a of the first OLED (OLED1) are connected may be cut by using a laser.

Also, the first horizontal repair line RH_1 and the second source 105 of the second driving TFT (DT2) may be welded by using a laser. Accordingly, a repair hole B may be formed between the first horizontal repair line RH_1 and the second source electrode 105b and may be filled with a conductive material, for example, a transparent conductive material forming the first horizontal repair line RH_1, so that the first horizontal repair line RH_1 and the second source electrode 105b may be electrically connected.

In this manner, since a repair process connecting the subpixel 1R (SR1) and the subpixel 2R (SR2) is performed by using the first horizontal repair line RH_1, even though the first driving TFT (DT1) is defective in operation, the subpixel 1R (SR1) may be operated by the second driving TFT (DT2) of the subpixel 2R (SR2).

Here, the second driving TFT (DT2) requires a driving current greater than that for driving only the second OLED (OLED2), and thus, the timing controller 140 may adjust a magnitude of image data RGB' according to compensation data generated by the compensation unit 145 and output the same. Also, the data driver 130 may adjust a magnitude of the data voltage applied to the subpixel 2R (SR2), that is, a magnitude of the data voltage applied to the fifth data line DL5, according to the image data RGB' adjusted in magnitude and output the same.

Meanwhile, the other subpixels, that is, the subpixel G (SG1), the subpixel B (SB1) and the subpixel W (SW1) may also be connected to corresponding subpixels of the second pixel P through a horizontal repair line RHL to form a repair structure.

In other words, the subpixel G (SG1) of the first pixel P1 may form a repair structure with the subpixel G (SG2) of the second pixel P2 through a second horizontal repair line RH_2, the subpixel B (SB1) of the first pixel P1 may form a repair structure with the subpixel B (SB2) of the second pixel P2 through a third horizontal repair line RH_3, and the subpixel W (SW1) of the first pixel P1 may form a repair structure with the subpixel W (SW2) of the second pixel P2 through a fourth horizontal repair line RH_4. Here, each of the horizontal repair lines may be lines formed as the ends of the anode electrodes of the OLEDs provided in the subpixels of the first pixel P1

As described above, in the organic light emitting display device 100 according to the present embodiment, the horizontal directional repair structure is formed by connecting all the subpixels of the two pixels P1 and P2 adjacent in the horizontal direction in the display panel 110 in a corresponding manner through the horizontal repair lines RHL. Thus, even though a dark spot is generated in any one of the two pixels P1 and P2 due to a defective operation, the pixel including the defective operation may be compensated by using the other pixel forming the repair structure.

Also, in the organic light emitting display device 100 according to the present embodiment, since the repair structure is formed between the two pixels P1 and P2 adjacent side to side in the display panel 110, even though a 3D image is displayed on the organic light emitting display device 100, the two pixels P1 and P2 having the repair structure displays the same 2D image, for example, the same left eye 2D image or the same right eye 2D image. Thus, since the left eye image and the right eye image are simultaneously displayed in the 3D image, generation of a bright spot may be prevented.

Figure 7:
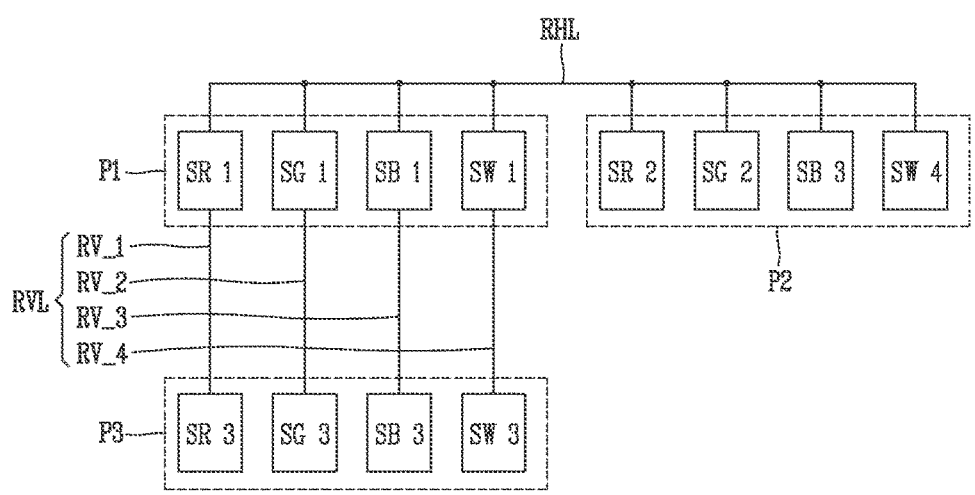
FIG. 7 is a view schematically illustrating a pixel repair structure of a display panel according to another embodiment of the present invention.

FIG. 7 is a view schematically illustrating a pixel repair structure of a display panel according to another embodiment of the present disclosure.

As illustrated in FIGS. 3 and 7, in the display panel 110 according to the present embodiment, two pixel repair structures, for example, a first repair structure and a second repair structure, may be formed.

The first repair structure may be formed by connecting the first pixel P1 and the second pixel P2 which are adjacent in a horizontal direction, that is, which are connected by the same scan line and adjacent in the horizontal direction, through a single horizontal repair line RHL.

The second repair structure may be formed by connecting the first pixel P1 and the third pixel P3 which are adjacent in an up/down direction, that is, which are connected by the same data line and adjacent in the vertical direction, through one or more vertical repair lines RHL.

In other words, the display panel 110 may include the first pixel P1, the second pixel P2, and the third pixel P3. Each of the pixels may include a subpixel R (SR), a subpixel G (SG), a subpixel B (SB), and a subpixel W (SW). Here, the first pixel P1 and the second pixel P2 are adjacent in the horizontal direction in the display panel 110, and the first pixel P1 and the third pixel P3 are adjacent in the vertical direction in the display panel 110.

The first pixel P1 and the second pixel P2 may form the first repair structure through one horizontal repair line RHL. One of the subpixel R (SR1), the subpixel G (SG1), the subpixel B (SB1), and the subpixel W (SW1) may be connected to the subpixel R (SR2), the subpixel G (SG2), the subpixel B (SB2), and the subpixel W (SW2) of the second pixel P2 in a corresponding manner to form a repair structure in a horizontal direction.

Also, the first pixel P1 and the third pixel P3 may form the second repair structure through one or more vertical repair lines RVL. The subpixel R (SR1) of the first pixel P1 and the subpixel R (SR3) of the third pixel P3 may be connected through a first vertical repair line RV_1, the subpixel G (SG1) of the first pixel P1 and the subpixel G (SG30 of the third pixel P3 may be connected through a second vertical repair line RV_2, the subpixel B (SB1) of the first pixel P1 and the subpixel B (SB3) of the third pixel P3 may be connected through a third vertical repair line RV_3, and the subpixel W (SW1) of the first pixel P1 and the subpixel W (SW3) of the third pixel P3 may be connected through a fourth vertical repair line RV_4. In this manner, all the subpixels of the first pixel P1 may be connected to the corresponding subpixels of the third pixel P3 through the plurality of vertical repair lines RVL to form a repair structure in the vertical direction.

That is, in the display panel 110 according to the present disclosure, since the repair structures are formed in the horizontal direction and the vertical direction with respect to one pixel, for example, the first pixel P1, when the first pixel P1 is defective in operation, a compensation operation may be performed to repair the first pixel P1 through other pixel adjacent thereto, for example, through one of the second pixel P2 and the third pixel P3.

Figure 8:
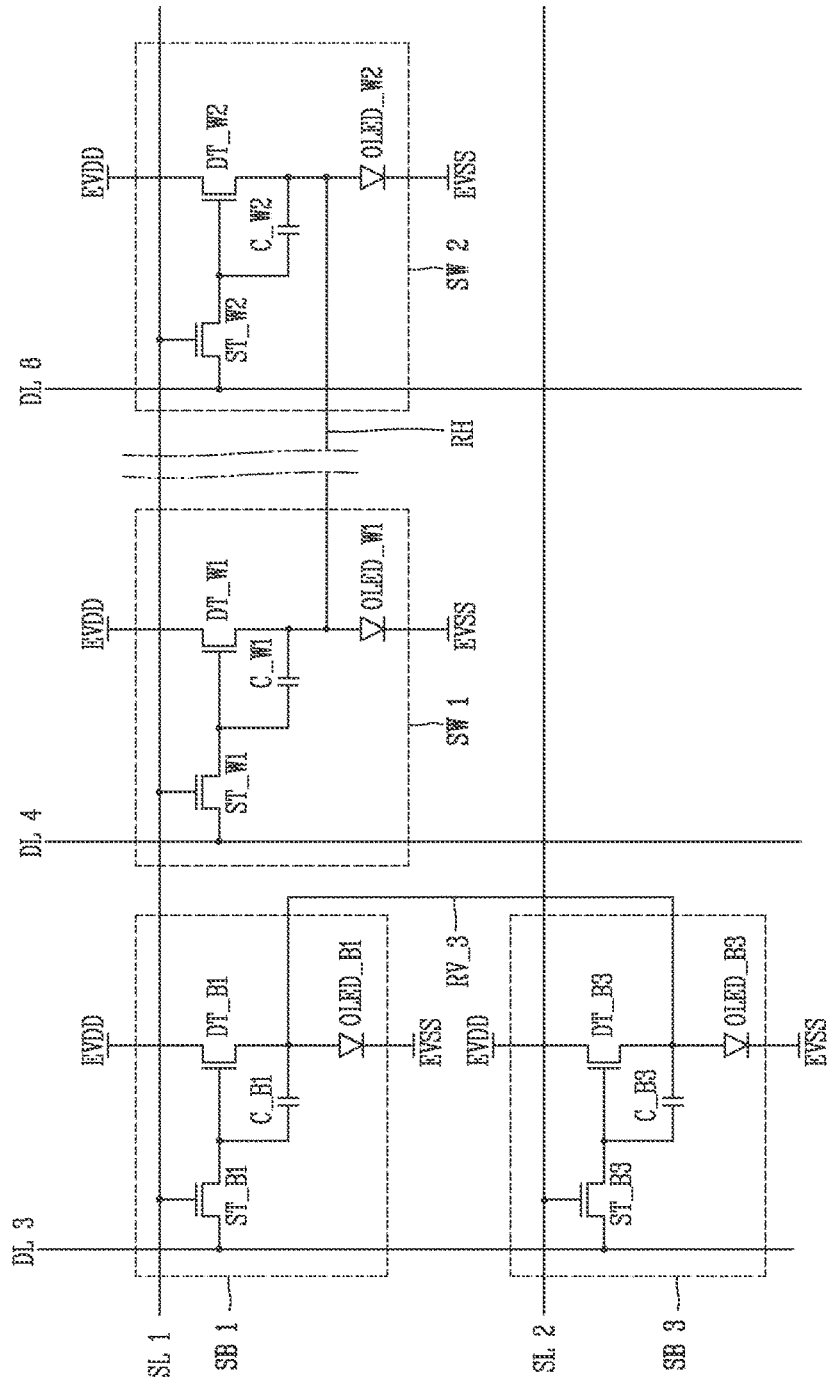
FIG. 8 is a circuit diagram of the pixel repair structure of FIG. 7.
Figure 9A:
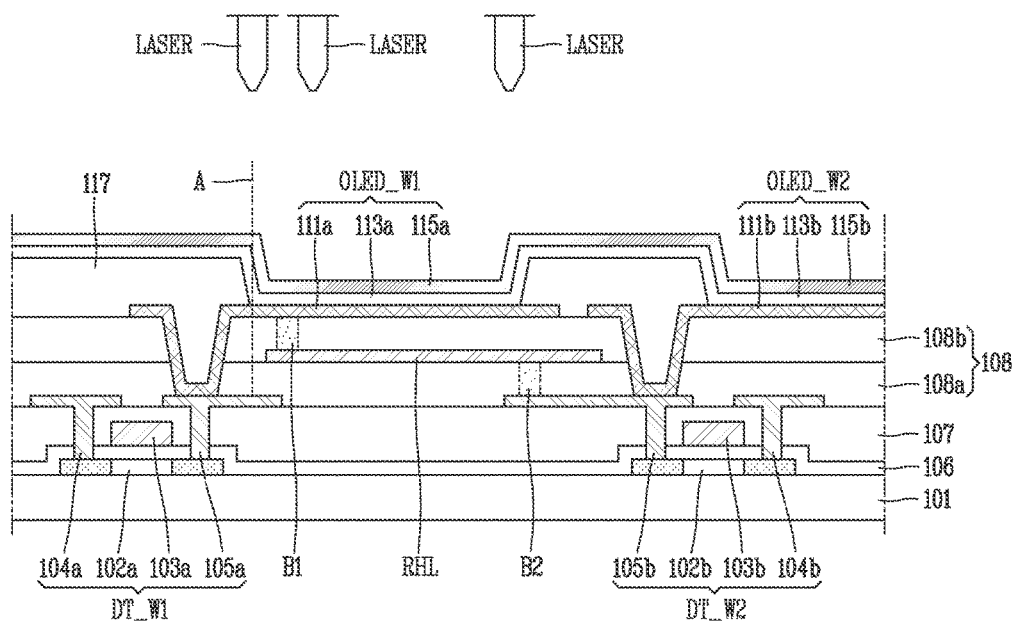
FIGS. 9A and 9B are cross-sectional views illustrating portions of the circuit illustrated in FIG. 8.
Figure 9B:
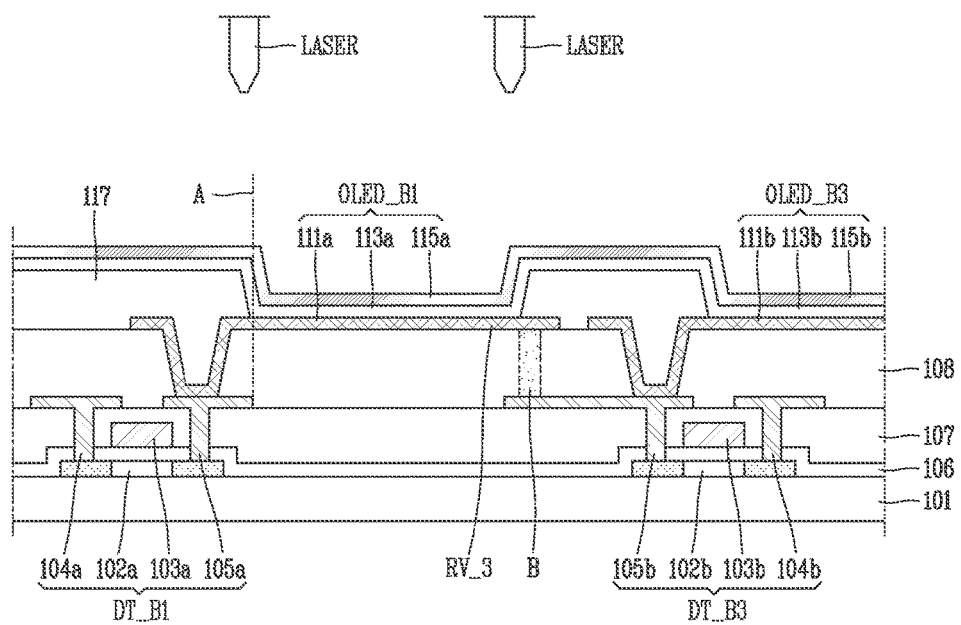

FIG. 8 is a circuit diagram of the pixel repair structure of FIG. 7, and FIGS. 9A and 9B are cross-sectional views illustrating portions of the circuit illustrated in FIG. 8.

For the purposes of description, the first repair structure between the subpixel W (SW1) of the first pixel P1 and the subpixel W (SW2) of the second pixel Pw adjacent thereto in the horizontal direction and the second repair structure between the subpixel B (SB1) of the first pixel P1 and the subpixel B (SB3) of the third pixel P3 adjacent thereto in the vertical direction will be separately described.

Also, the subpixel W (SW1) of the first pixel P1 and the subpixel W (SW2) of the second pixel P2 will be referred to as a first W subpixel and a second W subpixel, respectively, and the subpixel B (SB1) of the first pixel P1 and the subpixel B (SB3) of the third pixel P3 will be referred to as a first B subpixel and a third B subpixel, respectively.

As illustrated in FIG. 8, in the display panel 110 according to the present embodiment, the first W subpixel SW1 and the second W subpixel SW2 adjacent in the horizontal direction may form a repair structure through a horizontal repair line RHL.

The first W subpixel (SW1) may include a first switching TFT (ST_W1), a first driving TFT (DT_W1), a first OLED (OLED_W1), and a first storage capacitor C_W1, and the second W subpixel SW2 may include a second switching TFT (ST_W2), a second driving TFT (DT_W2), a second OLED (OLED_W2), and a second storage capacitor C_W2. The first W subpixel SW1 and the second W subpixel SW2 may be connected through the horizontal repair line RHL to form a repair structure.

A gate electrode of the first switching TFT (ST_W1) may be connected to a first scan line SL1, a drain electrode thereof may be connected to a fourth data line DL4, and a source electrode thereof may be connected to a gate electrode of the first driving TFT (DT_W1).

A gate electrode of the second switching TFT (ST_W2) may be connected to the first scan line SL1, a drain electrode thereof may be connected to an eighth data line DL8, and a source electrode thereof may be connected to a gate electrode of the second driving TFT (DT_W2).

The first driving TFT (DT_W1) and the second driving TFT (DT_W2) may be turned on according to a voltage applied to the gate electrode thereof, and may control a magnitude of a current flowing from a driving voltage EVDD to the first OLED (OLED_W1) and the second OLED (OLED_W2) according to a gate-source voltage Vgs.

The driving voltage EVDD may be applied to a drain electrode of the first driving TFT (DT_W1), and a source electrode thereof may be connected to an anode electrode of the first OLED (OLED_W1). The driving voltage EVDD is applied to a drain electrode of the second driving TFT (DT_W2), and a source electrode thereof may be connected to an anode electrode of the second OLED (OLED_W2).

The first storage capacitor C_W1 and the second storage capacitor C_W2 may uniformly maintain a voltage applied to the gate electrodes of the first driving TFT (DT_W1) and the second driving TFT (DT_W2) during 1 frame period.

As illustrated in FIG. 9A, a first semiconductor layer 102a and a second semiconductor layer 102b may be formed on the substrate 101. The first semiconductor layer 102a and the second semiconductor layer 102b may be spaced apart from one another from each other by a predetermined interval, for example, by a predetermined number of data lines DL. The semiconductor layer 102a and the second semiconductor layer 102b may be formed on the same layer through the same process and may each include a channel region and a source/drain region doped.

A gate insulating layer 106 may be formed on the first semiconductor layer 102a and the second semiconductor layer 102b. On the gate insulating layer 106, a first gate electrode 103a corresponding to the channel region of the first semiconductor layer 102a and a second gate electrode 103b corresponding to the channel region of the second semiconductor layer 102b are formed.

An interlayer insulating layer 107 may be formed on the first gate electrode 103a and the second gate electrode 103b. A contact hole (not shown) exposing the source/drain region of each of the first semiconductor layer 102a and the second semiconductor layer 102b may be formed in the interlayer insulating layer 107 and the gate insulating layer 106.

A first source electrode 105a and a first drain electrode 104a connected to the source/drain region of the first semiconductor layer 102a may be formed on the interlayer insulating layer 107. Also, a second source electrode 105b and a second drain electrode 104b connected to the source/drain region of the second semiconductor layer 102b may be formed through the same process.

In this manner the first driving TFT (DT_W1) including the first semiconductor layer 102a, the first gate electrode 103a, the first source electrode 105a, and the first drain electrode 104a may be formed, and the second driving TFT (DT_W2) including the second semiconductor layer 102b, the second gate electrode 103b, the second source electrode 105b, and the second drain electrode 104b may be formed.

As illustrated in FIG. 8, the first OLED (OLED_W1) may be connected between the first driving TFT (DT_W1) and a base voltage EVSS. An anode electrode of the first OLED (OLED_W1) may be connected to the source electrode of the first driving TFT (DT_W1) and the base voltage EVSS may be applied to a cathode of the first OLED (OLED_W1).

The second OLED (OLED_W2) may be connected between the second driving TFT (DT_W2) and the base voltage EVSS. An anode electrode of the second OLED (OLED_W2) may be connected to the source electrode of the second driving TFT (DT_W2) and the base voltage EVSS may be applied to a cathode of the second OLED (OLED_W2).

An anode electrode of the first OLED (OLED_W1) may be connected to the second source electrode 105b of the second driving TFT (DT_W2) or the anode electrode of the second OLED (OLED_W2) through the horizontal repair line RHL.

As illustrated in FIG. 9A, a protective layer 108 may be formed on the first driving TFT (DT_W1) and the second driving TFT (DT_W2). The protective layer 108 may include a first protective layer 108a and a second protective layer 108b in a dual-layer structure.

A horizontal repair line RHL may be formed on the first protective layer 108a. One side of the horizontal repair line RHL may overlap the first source electrode 105a of the first driving TFT (DT_W1) on the first protective layer 108a, and the other side of the horizontal repair line RHL may overlap the second source electrode 105b of the second driving TFT (DT_W2) on the first protective layer 108a. The horizontal repair line RHL may be formed of the same transparent material as the anode electrodes 111a and 111b of the first OLED (OLED_W1) and the second OLED (OLED_W2), but the present disclosure is not limited thereto.

Meanwhile, the horizontal repair line RHL may be formed on the same layer as the anode electrodes of the first OLED (OLED_W1) and the second OLED (OLED_W2). For example, the horizontal repair line RHL may be formed to overlap the first source electrode 105a of the first driving TFT (DT_W1) and the second source electrode 105b of the second driving TFT (DT_W2) between the anode electrode 111a of the first OLED (OLED_W1) and the second OLED (OLED_W2).

A second protective layer 108b may be formed on the horizontal repair line RHL. Also, a contact hole exposing the first source electrode 105a of the first driving TFT (DT_W1) and the second source electrode 105b of the second driving TFT (DT_W2) may be formed on the first protective layer 108a and the second protective layer 108b.

The first anode 111a connected to the first source electrode 105a of the first driving TFT (DT_W1) through the contact hole and the second anode electrode 111b connected to the second source electrode 105b of the second driving TFT (DT_W2) through the contact hole may be formed on the second protective layer 108b.

A bank layer 117 may be formed on the first anode electrode 111a and the second anode electrode 111b. The bank layer 117 may expose a portion of the first anode electrode 111a and a portion of the second anode electrode 111b.

Organic emission layers 113a and 113b may be formed on the bank layer 117. The organic emission layers 113a and 113b may be formed to cover the bank layer 117 on the entire surface of the substrate 101. Cathode electrodes 115a and 115b may be formed on the organic emission layers 113a and 113b. The cathode electrodes 115a and 115b may be formed to cover the organic emission layers 113a and 113b on the entire surface of the substrate 101.

In this manner, the first OLED (OLED_W1) including the first anode electrode 111a, the organic emission layer 113a, and the cathode electrode 115a may be formed on the first driving TFT (DT_W1). Also, the second OLED (OLED_W2) including the second anode electrode 111b, the organic emission layer 113b, and the cathode electrode 115b may be formed on the second driving TFT (DT_W2).

As described above, in the display panel 110 of the present embodiment, a repair structure may be formed between the first W subpixel SW1 and the second W subpixel SW2 by forming the horizontal repair line RHL on the first protective layer 108 to overlap the first source electrode 105a of the first driving TFT (DT_W1) and the second source electrode 105B of the second driving TFT (DT_W2).

Thus, even though the first driving TFT (DT_W1) is defective in operation, the second driving TFT (DT_W2) and the first OLED (OLED_W1) may be connected through the horizontal repair line RHL. Through this connection, the first OLED (OLED_W1) may be operated by the second driving TFT (DT_W2), and accordingly, the first W subpixel SW1 may be prevented from having a dark spot due to a defective operation of the first driving TFT (DT_W1).

In other words, when the first driving TFT (DT_W1) of the first W subpixel SW1 is defective in operation, a connection portion A between the first driving TFT (DT_W1) and the first OLED (OLED_W1) may be cut by using a laser.

Also, the first anode electrode 111a of the first OLED (OLED_W1) and the horizontal repair line RHL may be welded by using a laser, and the second source electrode 105b of the second driving TFT (DT_W2) and the horizontal repair line RHL may be welded by using a laser. Accordingly, repair holes B1 and B2 may be formed between the first anode electrode 111a and the horizontal repair line RHL and between the second source electrode 105b and the horizontal repair line RHL and filled with a conductive material, so that the first anode electrode 111a, the horizontal repair line RHL, and the second source electrode 105b may be connected to each other.

In this manner, since the repair process is performed between the first W subpixel SW1 and the second W subpixel SW2 by using the horizontal repair line RHL, even though the first driving TFT (DT_W1) is defective in operation, the first W subpixel SW1 may be operated by the second driving TFT (DT_W2).

Here, the second driving TFT (DT_W2) requires a driving current greater than that for driving only the second OLED (OLED_W2), and thus, the timing controller 140 may adjust a magnitude of image data RGB' according to compensation data generated by the compensation unit 145 and output the same. Also, the data driver 130 may adjust a magnitude of the data voltage applied to the second W subpixel SW2, that is, a magnitude of the data voltage applied to the eighth data line DL8, according to the image data RGB' adjusted in magnitude and output the same.

As described above, in the display panel 110 of the present embodiment, the repair structure may be formed by connecting one of all the subpixels of the pixel P1 and one of all of the subpixels of the pixel P2 adjacent to each other in the horizontal direction in a corresponding manner. Thus, even though a dark spot occurs due to a defective operation in one of two subpixels, for example, the first W subpixel SW1 and the second W subpixel SW2, connected through the horizontal repair line RHL, the subpixel including the defective operation may be compensated by using the other subpixel.

Meanwhile, a single horizontal repair line RHL is formed between two pixels P1 and P2 adjacent in the horizontal direction of the display panel. Thus, one of the plurality of subpixels of the pixel P1 and one of the plurality of subpixels of the pixel P2 may be connected to each other through the horizontal repair line PHL to form a repair structure.

As illustrated in FIGS. 8 and 9, in the display panel 110 of the present disclosure, the subpixel W SW1 of the first pixel and the subpixel W SW2 of the second pixel P2 are connected through the horizontal repair line RHL to form the repair structure in the horizontal direction. Thus, when a 3D image is displayed on the organic light emitting display device 100 according to the present embodiment, since the subpixel W SW1 of the first pixel P1 and the subpixel W SW2 of the second pixel P2 having the repair structure formed in the horizontal direction display the same 2D image, a bright spot generated as a left eye image and a right eye image are simultaneously displayed in a 3D image may be prevented.

Referring back to FIG. 8, in the display panel 110 according to the present embodiment, a repair structure may be formed between a first B subpixel SB1 and a third B subpixel SB3 adjacent in the vertical direction, that is, in the up/down direction, through a plurality of vertical repair lines RVL.

The first B subpixel SB1 may include a first switching TFT (ST_B1), a first driving TFT (DT_B1), a first OLED (OLED_B1), and a first storage capacitor C_B1, and the third B subpixel SB3 may include a third switching TFT (ST_B3), a third driving TFT (DT_B3), a third OLED (OLED_B3), and a third storage capacitor C_B3. The first B subpixel SB1 and the third B subpixel SB3 may be connected through a third vertical repair line RV_3, among a plurality of vertical repair lines RVL, to form a second repair structure.

A gate electrode of the first switching TFT (ST_B1) may be connected to a first scan line SL1, a drain electrode thereof may be connected to a fourth data line DL4, and a source electrode thereof may be connected to a gate electrode of the first driving TFT (DT_B1).

A gate electrode of the third switching TFT (ST_B3) may be connected to the first scan line SL1, a drain electrode thereof may be connected to an eighth data line DL8, and a source electrode thereof may be connected to a gate electrode of the third driving TFT (DT_B3).

The first driving TFT (DT_B1) and the third driving TFT (DT_B3) may be turned on according to a voltage applied to the gate electrode thereof, and may control a magnitude of a current flowing from a driving voltage EVDD to the first OLED (OLED_B1) and the third OLED (OLED_B3) according to a gate-source voltage Vgs.

The first storage capacitor C_B1 and the third storage capacitor C_B3 may uniformly maintain a voltage applied to the gate electrodes of the first driving TFT (DT_B1) and the third driving TFT (DT_B3) during 1 frame period.

The first OLED (OLED_B1) may be connected between the first driving TFT (DT_B1) and the base voltage EVSS. An anode electrode of the first OLED (OLED_B1) may be connected to a source electrode of the first driving TFT (DT_B1) and the base voltage EVSS may be applied to a cathode electrode thereof.

The third OLED (OLED_B3) may be connected between the third driving TFT (DT_B3) and the base voltage EVSS. An anode electrode of the third OLED (OLED_B3) may be connected to a source electrode of the third driving TFT (DT_B3) and the base voltage EVSS may be applied to a cathode electrode thereof.

The anode electrode of the first OLED (OLED_B1) may be connected to a third source electrode 105b of the third driving TFT (DT_B3) or to the anode electrode of the third OLED (OLED_B3) through a third vertical repair line RV_3. Here, the third vertical repair line RV_3 may be a line formed as the anode electrode of the first OLED (OLED_B1) or the anode electrode of the third OLED OLED_B3 extends.

As illustrated in FIG. 9B, a first semiconductor layer 102a and a third semiconductor layer 102b may be formed on the substrate 101. The first semiconductor layer 102a and the third semiconductor layer 102b may be spaced apart from one another from each other by a predetermined interval, for example, by a pair of scan lines SL. The first semiconductor layer 102a and the third semiconductor layer 102b may be formed on the same layer through the same process and may each include a channel region and a source/drain region.

A gate insulating layer 106 may be formed on the first semiconductor layer 102a and the third semiconductor layer 102b. On the gate insulating layer 106, a first gate electrode 103a corresponding to the channel region of the first semiconductor layer 102a and a third gate electrode 103b corresponding to the channel region of the third semiconductor layer 102b are formed.

An interlayer insulating layer 107 may be formed on the first gate electrode 103a and the second gate electrode 103b. A contact hole (not shown) exposing the source/drain region of each of the first semiconductor layer 102a and the second semiconductor layer 102b may be formed in the interlayer insulating layer 107 and the gate insulating layer 106.

A first source electrode 105a and a first drain electrode 104a connected to the source/drain region of the first semiconductor layer 102a may be formed on the interlayer insulating layer 107. Also, a third source electrode 105b and a third drain electrode 104b connected to the source/drain region of the third semiconductor layer 102b may be formed through the same process.

In this manner the first driving TFT (DT_B1) including the first semiconductor layer 102a, the first gate electrode 103a, the first source electrode 105a, and the first drain electrode 104*a* may be formed on the substrate 101. Also, the third driving TFT (DT_B3) including the third semiconductor layer 102*b*, the third gate electrode 103*b*, the third source electrode 105*b*, and the third drain electrode 104*b* may be formed on the substrate 101.

A protective layer 108 may be formed on the first driving TFT (DT_B1) and the third driving TFT (DT_B2). Contact holes exposing the first source electrode 105*a* of the first driving TFT (DT_B1) and the third source electrode 105*b* of the third driving TFT (DT_B3) may be formed in the protective layer 108.

A first anode electrode 111*a* connected to the first source electrode 105*a* of the first driving TFT (DT_B1) and a second anode electrode 111*b* connected to the third source electrode 105*b* of the third driving TFT (DT_B3) through the contact holes may be formed on the protective layer 108. One end of the first anode electrode 111*a* may extend to overlap the third source electrode 105*b* of the third driving TFT (DT_B3) to form a third horizontal repair line RV_3.

A bank layer 117 may be formed on the first anode electrode 111*a* and the second anode electrode 111*b*. The bank layer 117 may expose a portion of the first anode electrode 111*a* and a portion of the second anode electrode 111*b*. The regions exposed by the bank layer 117 may be emission regions.

Organic emission layers 113*a* and 113*b* may be formed on the bank layer 117. The organic emission layers 113*a* and 113*b* may be formed to cover the bank layer 117 on the entire surface of the substrate 101. Cathode electrodes 115*a* and 115*b* may be formed on the organic emission layers 113*a* and 113*b*. The cathode electrodes 115*a* and 115*b* may be formed to cover the organic emission layers 113*a* and 113*b* on the entire surface of the substrate 101.

In this manner, the first OLED (OLED_B1) including the first anode electrode 111*a*, the organic emission layer 113*a*, and the cathode electrode 115*a* may be formed on the first driving TFT (DT_B1). Also, the third OLED (OLED_B3) including the second anode electrode 111*b*, the organic emission layer 113*b*, and the cathode electrode 115*b* may be formed on the third driving TFT (DT_B3).

As described above, in the display panel 110 of the present exemplary embodiment, the third vertical repair line RV_3 are integrally formed at the end of the first anode electrode 111*a* of the first OLED (OLED_B1) provided in the subpixel 1B (SB1), and extends to overlap the third source electrode 105*b* of the third driving TFT (DT_B3), forming a second repair structure between the subpixel 1B (SB1) and the subpixel 3B (SB3).

Thus, even though the first driving TFT (DT_B1) is defective in operation, the third driving TFT (DT_B3) and the first OLED (OLED_B1) may be connected through the third vertical repair line RV_3. Through this connection, the first OLED (OLED_B1) may be operated by the third driving TFT (DT_B3), and thus, the subpixel 1B (SB1) is prevented from having a dark spot due to a defective operation of the first driving TFT (DT_B1).

In other words, in a case in which the first driving TFT (DT_B1) of the subpixel 1B (SB1) is defective in operation, a portion A in which the first driving TFT (DT_B1) and the first OLED (OLED_B1) are connected may be cut.

And then, the third vertical repair line RV_3 formed at the end of the first anode electrode 111*a* and the third source electrode 105*b* of the third driving TFT (DT_B3) may be welded by using a laser. Accordingly, a repair hole B is formed between the third vertical repair line RV_3 and the third source electrode 105 and filled with a conductive material to connect the first anode electrode 111*a* and the third source electrode 105*b*.

In this manner, by performing the repair process between the subpixel 1B (SB1) and the subpixel 3B (SB3) by using the third vertical repair line RV_3, even though the first driving TFT (DT_B1) is defective in operation, the subpixel 1B (SB1) may be operated by the third driving TFT (DT_B3).

Here, the third driving TFT (DT_B3) requires a driving current greater than that for driving only the third OLED (OLED_B3), and thus, the timing controller 140 may adjust a magnitude of image data RGB' according to compensation data generated by the compensation unit 145 and output the same. Also, the data driver 130 may adjust a magnitude of the data voltage applied to the subpixel 3B (SB3), that is, a magnitude of the data voltage applied to the third data line DL3, according to the image data RGB' adjusted in magnitude and output the same.

As described above, in the organic light emitting display device 100 according to the present embodiment, a repair structure may be formed by connecting all the subpixels of the two pixels P1 and P3 adjacent in the vertical direction in the display panel 110 in a corresponding manner through the vertical repair lines RVL. Thus, even though a dark spot is generated in any one of the two pixels P1 and P3 due to a defective operation, the pixel including the defective operation may be compensated by using the other pixel forming the repair structure.

Meanwhile, as illustrated in FIG. 9A, the subpixel 1W (SW1) of the first pixel P1 forms the first repair structure with the subpixel 2W (SW2) of the second pixel P2 through the horizontal repair line RHL.

Thus, the other subpixels including the subpixel 1B (SB1) of the first pixel P1, that is, subpixel 1R (SR1), the subpixel 1G (SG1), and the subpixel 1B (SB1), may form a second repair structure with the subpixels of the third pixel P3 through the vertical repair lines, for example, the first vertical repair line RV_1, the second vertical repair line RV_2, and the third vertical repair line RV_3, respectively.

Also, one of the subpixel 1R (SR1), the subpixel 1G (SG1), the subpixel 1B (SB1), and the subpixel 1W (SW1) may form a first repair structure with corresponding subpixels of the second pixel P2 through the horizontal repair lines RHL. Here, the other subpixels of the first pixel P1 may form a second repair structure with corresponding subpixels of the third pixel P3 through the vertical repair lines RVL.

Figures 10A, 10B:
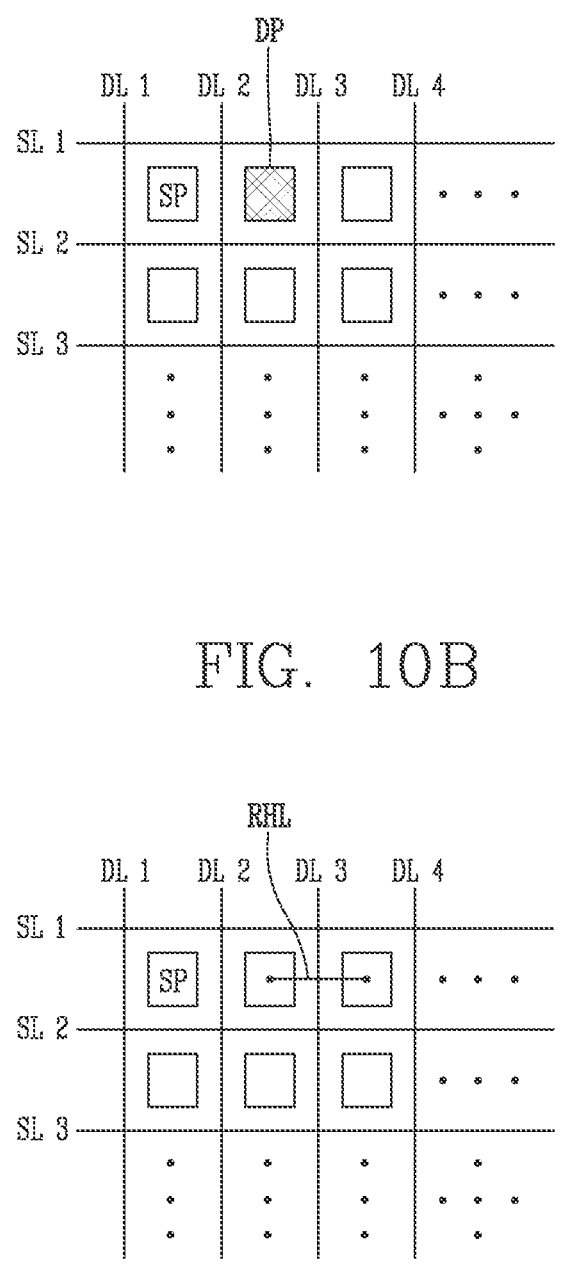
Figures 11A, 11B:
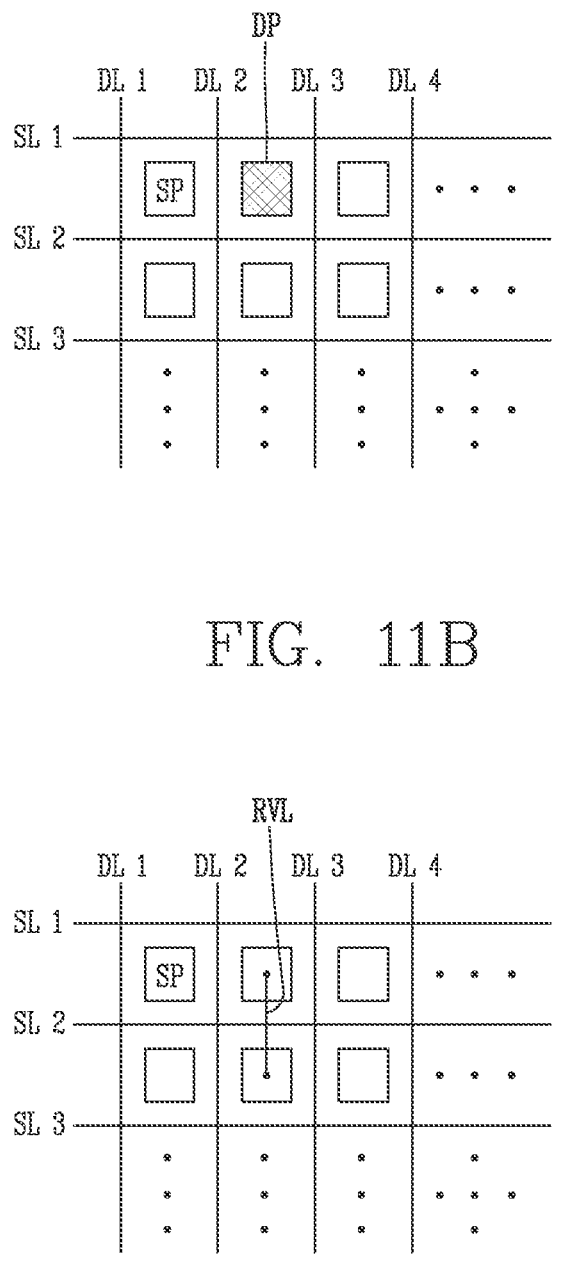

FIGS. 10A and 10B are views schematically illustrating pixel compensation driving based on a repair structure formed in a horizontal direction in a display panel, and FIGS. 11A and 11B are views schematically illustrating pixel compensation driving based on a repair structure formed in a vertical direction in a display panel.

As illustrated in FIG. 10A, a dark spot DP may appear as a defective operation occurs in the subpixel SP connected to the first scan line SL1 and the second data line DL2. Thus, as illustrated in FIG. 10B, the subpixel SP connected to the first scan line SL1 and the third data line DL3 according to the repair structure based on the horizontal repair line RHL drives the subpixel SP having the dark spot DP, whereby the subpixel SP having the dark spot DP may be normally operated.

Here, the timing controller 140 of FIG. 3 adjusts a magnitude of the image data RGB' according to compensation data generated by the compensation unit 145, and the data driver 130 may adjust a magnitude of a data voltage applied to the third data line DL3 according to the image data RFB' adjusted in magnitude and output the same.

As illustrated in FIG. 11A, a subpixel SP connected to the first scan line SL1 and the second data line DL2 is defective in operation and a dark spot DP may appear. Thus, as illustrated in FIG. 11B, the subpixel SP connected to the second scan line SL2 and the second data line DL2 according to the repair structure based on the vertical repair line RVL drives the subpixel SP having the dark spot DP, whereby the subpixel SP having the dark spot DP may be normally operated.

Here, the timing controller 140 of FIG. 3 adjusts a magnitude of the image data RGB' according to compensation data generated by the compensation unit 145, and the data driver 130 may adjust a magnitude of a data voltage applied to the second data line DL2 according to the image data RFB' adjusted in magnitude and output the same.

As described above, in the organic light emitting display device 100 according to an embodiment of the present disclosure, by forming a repair structure between one pixel P and another pixel P adjacent in the horizontal direction and vertical direction, even though a dark spot appears due to a defective operation of one pixel P, the pixel having the defective operation may be compensated and driven by using the other pixel P. Thus, production yield of the organic light emitting display device 100 according to an embodiment of the present disclosure may be enhanced.

Figure 12:
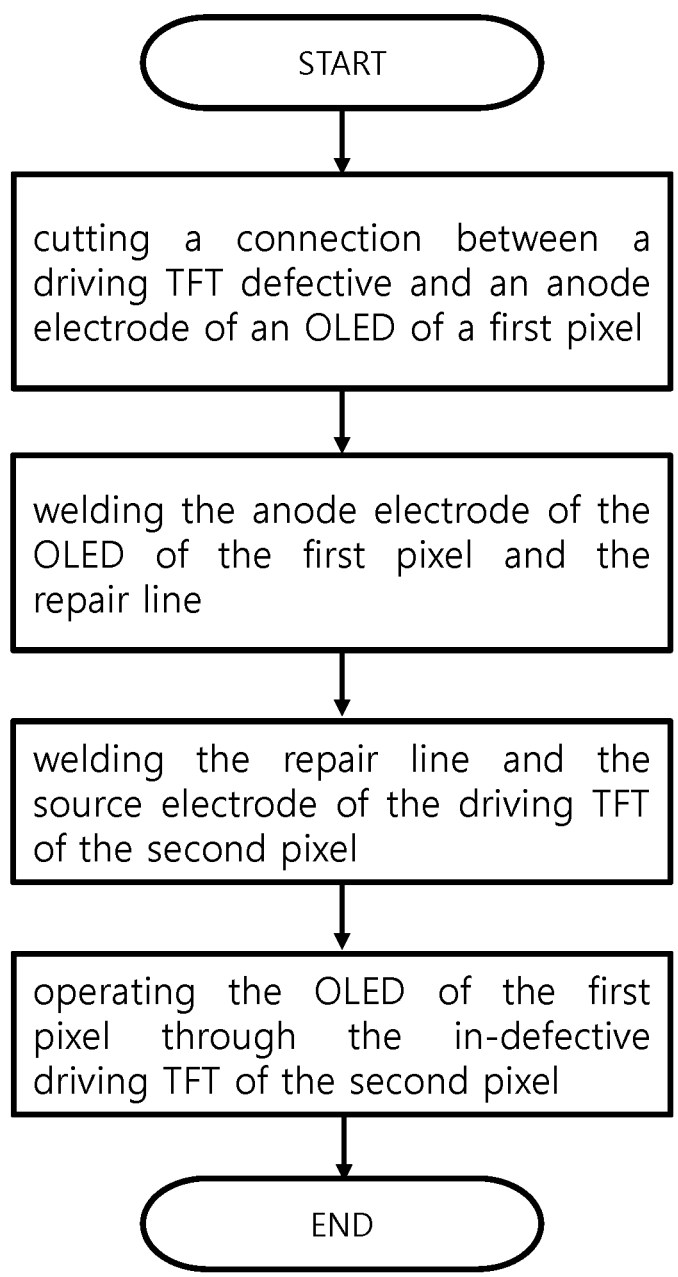
FIG. 12 is a flow chart which shows a repair method of an organic light emitting display device according to embodiments of the present invention.

Also, in the organic light emitting display device 100 according to an embodiment of the present disclosure, by forming the repair structure in a horizontal direction with respect to the subpixel W (SW) among the plurality of subpixels SP of the pixel P adjacent in the display panel 110, when a 3D image is displayed on the organic light emitting display device 100, the subpixels W (SW) of the pixels P having the repair structure in the horizontal direction display the same 2D image, and thus, a bright spot generated as a left eye image and a right eye image are simultaneously displayed in a 3D image may be prevented. For example, as shown in FIG. 12 and FIG. 9A, according to an embodiment of the present disclosure, a repair method of an organic light emitting display device including a plurality of pixels, each pixel among the plurality of pixels including an organic light emitting diode (OLED) in every pixel area defined as a plurality of scan lines and a plurality of data lines intersecting with each other, and the organic light emitting display device further including a repair structure in a horizontal direction by one or more repair lines between two or more adjacent pixels among the plurality of pixels, the repair method can include cutting a connection between a driving TFT defective in operation and an anode electrode of an OLED of a first pixel among the two or more adjacent pixels; repairing a source electrode of an in-defective driving thin-film transistor (TFT) of a second pixel and the anode electrode of the OLED of the first pixel by welding the repair line and the source electrode of the driving TFT of the second pixel adjacent to the first pixel; and operating the OLED of the first pixel through the in-defective driving TFT of the second pixel, in which the repair line extends from the end of the anode electrode of the OLED of the first pixel to overlap the source electrode of the driving TFT of the second pixel, and the repairing includes welding the repair line and the source electrode of the driving TFT of the second pixel to connect the repair line and the source electrode of the driving TFT of the second pixel.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A repair method of an organic light emitting display device including a plurality of pixels, each pixel among the plurality of pixels including an organic light emitting diode (OLED) in every pixel area defined as a plurality of scan lines and a plurality of data lines intersecting with each other, and the organic light emitting display device further including a repair structure in a horizontal direction by one or more repair lines between two or more adjacent pixels among the plurality of pixels, the repair method comprising:
    cutting a connection between a driving thin-film transistor (TFT) defective in operation and an anode electrode of an OLED of a first pixel among the two or more adjacent pixels;
    repairing a source electrode of an in-defective driving TFT of a second pixel and the anode electrode of the OLED of the first pixel by welding the repair line and the source electrode of the driving TFT of the second pixel adjacent to the first pixel; and
    operating the OLED of the first pixel through the in-defective driving TFT of the second pixel,
    wherein the repair line extends from the end of the anode electrode of the OLED of the first pixel to overlap the source electrode of the driving TFT of the second pixel, and
    wherein the repairing includes welding the repair line and the source electrode of the driving TFT of the second pixel to connect the repair line and the source electrode of the driving TFT of the second pixel.

2. The repair method of claim 1, wherein the repair line overlaps the driving TFT of the first pixel and the driving TFT of the second pixel below the anode electrodes of the OLEDs of the first pixel and the second pixel, and
    the repairing comprises:
    welding the anode electrode of the OLED of the first pixel and the repair line to connect the anode electrode of the OLED of the first pixel and the repair line; and
    welding the repair line and the source electrode of the driving TFT of the second pixel to connect the repair line and the source electrode of the driving TFT of the second pixel.

3. The repair method of claim 1, wherein the operating of the OLED of the first pixel comprises adjusting a magnitude of a data voltage applied to the second pixel.

* * * * *